(12) United States Patent
Xu et al.

(10) Patent No.: US 8,281,209 B2
(45) Date of Patent: Oct. 2, 2012

(54) ENCODING METHOD AND DEVICE FOR LOW DENSITY GENERATOR MATRIX CODES

(75) Inventors: Jun Xu, Guangdong Province (CN); Song Li, Guangdong Province (CN); Jin Xu, Guangdong Province (CN); Zhifeng Yuan, Guangdong Province (CN); Yuanli Fang, Guangdong Province (CN); Xiangbiao Yan, Guangdong Province (CN); Liujun Hu, Guangdong Province (CN)

(73) Assignee: ZTE Corporation (CN)

( * ) Notice: Subject to any disclaimer, the term of this patent is extended or adjusted under 35 U.S.C. 154(b) by 281 days.

(21) Appl. No.: 12/810,832

(22) PCT Filed: Jun. 12, 2008

(86) PCT No.: PCT/CN2008/071283
§ 371 (c)(1),
(2), (4) Date: Jun. 25, 2010

(87) PCT Pub. No.: WO2009/079934
PCT Pub. Date: Jul. 2, 2009

(65) Prior Publication Data
US 2010/0281332 A1 Nov. 4, 2010

(30) Foreign Application Priority Data
Dec. 25, 2007 (CN) .......................... 2007 1 0301397

(51) Int. Cl.
*G06F 11/00* (2006.01)
(52) U.S. Cl. ...................................... 714/752; 714/755
(58) Field of Classification Search .................. 714/752, 714/753, 755, 756, 757, 758, 759, 746
See application file for complete search history.

(56) References Cited

U.S. PATENT DOCUMENTS

| | | | | |
|---|---|---|---|---|
| 2008/0114711 A1* | 5/2008 | Nagaraj | .......................... | 706/37 |
| 2010/0185915 A1* | 7/2010 | Xu et al. | .......................... | 714/752 |
| 2010/0269010 A1* | 10/2010 | Xu et al. | .......................... | 714/752 |
| 2010/0275091 A1* | 10/2010 | Yuan et al. | .................... | 714/752 |
| 2012/0106414 A1* | 5/2012 | Nagaraj | ......................... | 370/310 |

* cited by examiner

*Primary Examiner* — Dieu-Minh Le
(74) *Attorney, Agent, or Firm* — WHGC, PLC; John F. O'Rourke; Erick P. Wolf

(57) ABSTRACT

The present invention discloses an encoding method and device for Low Density Generator Matrix Codes (LDGC). Wherein, the method comprises: construct an LDGC mother code set using a plurality of LDGC with code rate $R_0$ and different code lengths, wherein the LDGC mother code set has a uniform base matrix $G_b^{uniform} = \{(g_{i,j}^b)_{uniform}\}_{k_b \times n_b}$; obtain length L of an intermediate variable according to a relationship between length K of an information bit sequence to be encoded in the LDGC mother code set and length L of the intermediate variable; obtain an expanding factor z for processing the base matrix using the length of the intermediate variable and the number of rows in the base matrix; process the base matrix using the expanding factor to obtain a binary generator matrix Gtmp, the front L rows and front L columns of which compose a triangular matrix; modify the binary generator matrix to obtain a modified binary generator matrix; take a matrix $G_{ldgc}$ composed of L rows and the front N+L−K columns of the modified binary generator matrix as a generator matrix of the information bit sequence to encode the information bit sequence.

20 Claims, 2 Drawing Sheets

ENCODING METHOD AND DEVICE FOR LOW DENSITY GENERATOR MATRIX CODES

FIELD OF THE INVENTION

The present invention relates to communication field, and more particularly, relates to an encoding method and device for Low Density Generator Matrix Codes, LDGC.

BACKGROUND OF THE INVENTION

Erasure channel is an important channel model. For example, when files are transmitted on the Internet, communications are based on data packets, and usually, each data packet is either received by a receiver without any mistake, or not received by the receiver at all. In the Transmission Control Protocol (TCP for short), an error-check and retransmission mechanism is used against network packet loss, i.e., a feedback channel from an input end to an output end is used to control data packets which need to be retransmitted. The receiver generates a retransmission control signal upon detecting a packet loss, until the complete data packet is received correctly; and the receiver also generates a receiving Acknowledgement (ACK) signal upon receiving a data packet. A sender also traces each data packet until it receives a feedback informing signal, otherwise, the sender starts a retransmission.

The data broadcasting service based on streaming mode and file downloading mode is a point-to-multipoint service, in which no feedback is allowed and the conventional error-check and retransmission mechanism cannot be used, and thus Forward Error Correction (FEC for short) needs to be used to ensure reliable transmission. Typical FECs in the application layer comprises RS codes (Reed-Solomon codes), Fountain codes etc. The RS codes are of high complexity in encoding and decoding, and usually are applicable only in the cases where the code length is small. LT codes (Luby Transform codes) and Raptor codes are two kinds of Fountain codes applicable in practice. The LT codes have linear encoding and decoding time, and thus have substantial improvement compared to the RS codes. The Raptor codes have higher decoding efficiency because of the use of pre-coding technique. The Raptor codes are used as the FEC encoding scheme in Multimedia Broadcast/Multicast Service (MBMS for short) and Digital Video Broadcasting (DVB for short) of 3GPP ($3^{rd}$ Generation Partnership Project).

Low Density Generator matrix Codes (LDGC for short) are linear block codes, and the nonzero elements in the generator matrix thereof are usually sparse. Meanwhile, the LDGC are also systematic codes, and the square matrix composed of the front k columns of the generator matrix thereof is generally an upper triangular or lower triangular matrix, the inversion of which can be computed by iteration method. The encoding of the LDGC is to compute an intermediate variable using the corresponding relation between the information bits and the intermediate variable in the systematic codes, and then, to obtain encoded codewords by multiplying the generator matrix by the intermediate variable. The decoding process of the LDGC is to first compute an intermediate variable using the generator matrix, and then, to compute the information bits using the conversion relation between the information bits and the intermediate variable. The LDGC are much lower than the Raptor codes in encoding complexity, can support the encoding of any information block length and any code rate, and are similar to the Raptor codes in performance which can be close to the theoretical optimal performance.

Compared to the structured Low Density Generator Matrix Codes (LDGC), the LT codes do not support the encoding mode of the systematic codes. Thus, the LT codes can not satisfy some practical FEC encoding requirements. The Raptor codes support the systematic codes, however, the Raptor codes need a separate pre-coding process, i.e., a pre-coding matrix is needed, thus, the encoding complexity is high. The LDGC directly use a generator matrix for encoding, without any additional pre-coding matrix. Moreover, since the backward substitution method is used in the encoding of the LDGC to solve the upper triangular (or lower triangular) formulae, the LDGC are much lower than the Raptor codes in encoding complexity. In a word, compared to the LT codes, the advantage of the LDGC lies in that it supports the systematic codes; and compared to the Raptor codes, the advantage of the LDGC lies in that it has a lower encoding complexity.

Comparing the LDGC codes with the Raptor codes of Fountain company, the encoding complexity of the Raptor codes is relatively high, while there is almost no encoding complexity for the LDGC codes because it is very easy to solve trigonometric formula; since the column weight of the LDGC codes is far lower than that of the Raptor codes, the decoding complexity of the Raptor codes is relatively high while that of the LDGC codes is relatively low; and it should be pointed out that since there is specific density distribution, the matrix density in Gaussian elimination process becomes lower and lower so as to ensure a very low complexity of decoding algorithm; since the physical layer generally can guarantee a low BLER (Block Error Rate), the overhead required is usually not more than 25%, at this time, the LDGC codes can further provide a specially effective decoding algorithm to ensure a far lower decoding complexity than that of Raptor codes; the generating process of encoding and decoding matrix is much easier and faster than that of Raptor codes; the storage of the encoding and decoding matrix is far smaller than that of Raptor codes, for example, in the embodiments of the present invention, only a uniform base matrix of 12*40 is needed to be stored; finally, the LDGC codes are relatively flexible, supporting an arbitrary information group length K and an arbitrary encoding rate r.

SUMMARY OF THE INVENTION

The invention provides an encoding method and device for LDGC, to improve flexibility of the code length of LDGC, reduce storage space of the base matrix so as to decrease complexity of code compiling.

The encoding method for LDGC according to the embodiments of the present invention comprises the following steps: step 1, construct an LDGC mother code using a plurality of LDGC with code rate $R_0$ and different code length, wherein the LDGC mother code set has a uniform base matrix $G_b^{uniform} = \{(g_{i,j}^b)_{uniform}\}_{k_b \times n_b}$, $$R_0 = \frac{k_b}{n_b},$$

$k_b$ is the number of rows in the base matrix, and $n_b$ is the number of columns in the base matrix; step 2, obtain length L of an intermediate variable according to a relationship between length K of an information bit sequence to be encoded in the LDGC mother code set and length L of the intermediate variable; step 3, obtain an expanding factor z for processing the base matrix using the length of the intermediate variable and the number of rows in the base matrix; step 4, process the base matrix using the expanding factor to obtain a binary generator matrix Gtmp wherein the front L rows and the front L columns of the binary generator matrix compose a triangular matrix; and step 5, modify the binary generator matrix to obtain a modified binary generator matrix; and step 6, take a matrix $G_{ldgc}$ composed of L rows and the front N+L−K columns of the modified binary generator matrix as a generator matrix of the information bit sequence to encode the information bit sequence.

Wherein, step 4 comprises the following steps: step a, modify the base matrix using the expanding factor to obtain a modified base matrix $G_b^{modified}=\{g_{i,j}^b\}_{k_b}^{\times n_b}$; and step b, expand the modified base matrix using the expanding factor to obtain the binary generator matrix, wherein the binary generator matrix has a size of $(k_b \times z) \times (n_b \times z)$.

Wherein, the relationship between the length of the information bit sequence and the length of the intermediate variable is as follows: $L=k_b \cdot ceil((p \times K+q)/k_b)$, wherein both p and q are constants greater than 0. Herein, $k_b=12$, $p=1.0235$, $q=30$, ceil denotes a ceiling operation. The expanding factor is obtained using the length of the intermediate variable and the number of rows in the base matrix through following method: $z=L/k_b$.

Wherein, in step a, all elements $(g_{i,j}^b)_{uniform}$ denoting nonzero subblock square matrixes in the base matrix are modified using the expanding factor. Specifically, if all nonzero subblock square matrixes of the base matrix are not z*z zero matrixes, the following modifying operation is performed to all elements $(g_{i,j}^b)_{uniform}$ denoting nonzero subblock square matrixes in the base matrix using the expanding factor: $g_{i,j}^b=floor(z \cdot (g_{i,j}^b)_{uniform}/z_{max})$ wherein $z_{max}$ is a specific positive integer, herein, $z_{max}=683$, floor denotes a floor operation, and other elements remain unchanged.

Wherein, the binary generator matrix is constituted of $k_b \times n_b$ subblock square matrixes $P^{g_{i,j}^b}$ with a size of z×z, wherein the subblock square matrix with a size of z×z is a zero matrix, a unit matrix, or a cycle shift matrix of a unit matrix. Specifically, if the element $g_{i,j}^b$ of the modified base matrix is a numerical value (for example, −1) denoting a z*z zero matrix, the subblock square matrix $P^{g_{i,j}^b}=0$, wherein the subblock square matrix $P^{g_{i,j}^b}$ has a size of z×z, otherwise, the subblock square matrix $P^{g_{i,j}^b}=(P)^{g_{i,j}^b}$, wherein the subblock square matrix $P^{g_{i,j}^b}$ has a size of z×z, and $$P = \begin{bmatrix} 0 & 1 & 0 & \ldots & 0 \\ 0 & 0 & 1 & \ldots & 0 \\ \ldots & \ldots & \ldots & \ldots & \ldots \\ 0 & 0 & 0 & \ldots & 1 \\ 1 & 0 & 0 & \ldots & 0 \end{bmatrix}.$$

Wherein, in step 5, if all L rows and the front L columns of the binary generator matrix compose an upper right triangular or a lower right triangular matrix, the column weight of column offset to column z−1 of the binary generator matrix is increased to be 2, wherein offset is a positive integer within the range of 0 to z/3.

Wherein, in step 5, if all L rows and the front L columns of the binary generator matrix compose an upper right triangular matrix, the element at row i−1, column i of the binary generator matrix is set to be 1, wherein i is within the range of 1 to z−1.

Wherein, in step 5, if all L rows and the front L columns of the binary generator matrix compose an upper right triangular matrix, if (i+1)<12×z, an element $Gtmp_{i,i+1}$ at row i, column i+1 of the binary generator matrix is set to be 1, if (i+fix (z/12))<12×z, an element $Gtmp_{i,i+fix(z/12)}$ at row i, column i+fix(z/12) of the binary generator matrix is set to be 1, if (i+fix(z/4))<12×z, an element $Gtmp_{i,i+fix(z/4)}$ at row i, column (i+fix(z/4)) of the binary generator matrix is set to be 1, if (i+fix(z/3))<12×z, an element $Gtmp_{i,i+fix(z/3)}$ at row i, column (i+fix(z/3) of the binary generator matrix is set to be 1, wherein i is within the range of 11×z to 12×z−1, fix denotes a floor operation. In the case when i is within the range of 0 to 11×z−1, j is within the range of 11×z to 12×z−1, and $Gtmp_{i,j}=Gtmp_{i,j}+Gtmp_{i,j+25*z}+Gtmp_{i,j+26*z}+Gtmp_{i,j+27*z}+Gtmp_{i,j+28*z}$, if $Gtmp_{i,j}>1$, the element $Gtmp_{i,j}$ at row i, column j of the binary generator matrix is set to be 1. Wherein, the number of rows in the base matrix is 12 and the number of columns is 40.

Wherein, in step 5, if all L rows and the front L columns of the binary generator matrix compose an upper right triangular matrix, the element at row i−1, column i of the binary generator matrix is set to be 1, wherein i is within the range of 1 to z−1.

Wherein, in step 5, if all L rows and the front L columns of the binary generator matrix compose an upper right triangular matrix, if (i+1)<12×z, an element $Gtmp_{i,i+1}$ at row i, column i+1 of the binary generator matrix is set to be 1, if (i+fix(z/ 12))<12×z, an element $Gtmp_{i,i+fix(z/12)}$ at row i, column i+fix (z/12) of the binary generator matrix is set to be 1, if (i+fix (z/4))<12×z, an element $Gtmp_{i,i+fix(z/4)}$ at row i, column (i+fix (z/4)) of the binary generator matrix is set to be 1, if (i+fix(z/ 3))<12×z, an element $Gtmp_{i,i+fix(z/3)}$ at row i, column(i+fix(z/ 3) of the binary generator matrix is set to be 1, wherein i is within the range of 11×z to 12×z−1, fix denotes a floor operation. In the case when i is within the range of 0 to 11×z−1, j is within the range of 11×z to 12×z−1, and $Gtmp_{i,j}=Gtmp_{i,j}+Gtmp_{i,j+25*z}+Gtmp_{i,j+26*z}+Gtmp_{i,j+27*z}+Gtmp_{i,j+28*z}$, if $Gtmp_{i,j}>1$, the element Gtmp at row i, column j of the binary generator matrix is set to be 1. Wherein, the number of rows in the base matrix is 12 and the number of columns is 40.

Wherein, in step 5, modify the modified binary generator matrix for the use of encoding, permuting some columns of the check bit part of the binary generator matrix, for the purpose of further improvement on the performance of LDGC codes when the overhead is very low.

For example, when the overhead is very low, the column weight of the check bit part of the binary generator matrix is relatively large (column weight>10), a column permutation is required to make some columns with a relatively light weight (column weight<5) appear in the check bit part of the binary generator matrix, codes performance thereby can be improved when the overhead is very low. Wherein, the above check bit part refers to column L+1 to the last column, and the above column permutation refers to position exchange between two columns. Finally, the above column permutation is not necessary.

Preferably, the matrix generating process from step 1 to step 5 is interpenetrated in the encoding process in step 6.

The device for generating a generator matrix for LDGC according to the embodiments of the present invention comprises: base matrix storing means, for storing a uniform base matrix $G_b^{uniform}$ of an LDGC mother code set constructed by a plurality of LDGC with code rate R0 and different code lengths, wherein $$R_0 = \frac{k_b}{n_b},$$

kb is the number of rows in the base matrix, nb is the number of columns in the base matrix; matrix parameter calculating means, for calculating the length L of an intermediate variable according to a relationship between length K of an information bit sequence to be encoded in the LDGC mother code set and length L of the intermediate variable, and calculating an expanding factor z for processing the base matrix using the length of the intermediate variable and the number of rows in the base matrix; base matrix modifying means, for modifying the base matrix using the expanding factor to obtain a modified base matrix $G_b^{modified}$; base matrix expanding means, for expanding the modified base matrix using the expanding factor to obtain a binary generator matrix Gtmp, wherein all L rows and the front L columns of the binary generator matrix compose a triangular matrix; generator matrix modifying means, for modifying the binary generator matrix to obtain a modified binary generator matrix; and generator matrix extracting means, for extracting L rows and the front N+L−K columns of the modified binary generator matrix which is taken as a generator matrix $G_{ldge}$ for the use of encoding the information bit sequence, wherein N is the length of output codeword after encoding the information bit sequence.

Wherein, the relationship between the length of the information bit sequence and the length of the intermediate variable is as follows: $L=k_b \cdot ceil((p \times K+q)/k_b)$, wherein both p and q are constants greater than 0. Herein, $k_b=12$, $p=1.0235$, $q=30$, ceil denotes a ceiling operation. The matrix parameter calculating means obtains the expanding factor using the length of the intermediate variable and the number of rows in the base matrix through the following method: $z=L/k_b$.

Wherein, the base matrix modifying means performs a modifying operation to the element $(g_{i,j}^b)_{uniform}$ denoting all nonzero subblock square matrixes in the base matrix using the expanding factor. Specifically, the base matrix modifying means performs the following modifying operation to the elements $(g_{i,j}^b)_{uniform}$ denoting all nonzero subblock square matrixes in the base matrix using the expanding factor: $g_{i,j}^b = floor\ (z \cdot (g_{i,j}^b)_{uniform}/z_{max})$, wherein $z_{max}=683$, floor denotes a floor operation.

Wherein, the binary generator matrix is constructed by $k_b \times n_b$ subblock square matrixes $P^{g_{i,j}^b}$ with a size of z×z, wherein the subblock square matrix with a size of z×z is a zero matrix, a unit matrix, or a cycle shift matrix of a unit matrix. Specifically, if the element of the modified base matrix is an element (−1, for example) denoting z*z zero matrix, the subblock square matrix with a size of z×z $P^{g_{i,j}^b}=0$, otherwise, the subblock square matrix has a size of z×z $P^{g_{i,j}^b}=(P)^{g_{i,j}^b}$, wherein $$P = \begin{bmatrix} 0 & 1 & 0 & \ldots & 0 \\ 0 & 0 & 1 & \ldots & 0 \\ \ldots & \ldots & \ldots & \ldots & \ldots \\ 0 & 0 & 0 & \ldots & 1 \\ 1 & 0 & 0 & \ldots & 0 \end{bmatrix}.$$

Wherein, if all L rows and the front L columns of the binary generator matrix compose an upper right triangular or a lower right triangular matrix, the generator matrix modifying means increases the column weight of the column offset to column z−1 of the binary generator matrix to be 2, and increases the column weight of column $(k_b-1)*z$ to column $k_b*z-1$ of the binary generator matrix to be greater than or equal to 30, wherein offset is a positive integer within the range of 0 to z/3.

Wherein, if all L rows and the front L columns of the binary generator matrix compose an upper left triangular or a lower left triangular matrix, the generator matrix modifying means increases the column weight of column $(k_b-1)*z+offset$ to column $k_b*z-1$ of the binary generator matrix to be 2, and increases the column weight of column 0 to column z of the binary generator matrix to be greater than or equal to 30, wherein offset is a positive integer within the range of 0 to z/3.

Wherein, if all L rows and the front L columns of the binary generator matrix compose an upper right triangular matrix, the generator matrix modifying means sets the element at row i−1, column i of the binary generator matrix to be 1, wherein i is within the range of 1 to z−1.

Wherein, if all L rows and the front L columns of the binary generator matrix compose an upper right triangular matrix, if (i+1)<12×z, the generator matrix modifying means sets an element $Gtmp_{i,i+1}$ at row i, column i+1 of the binary generator matrix to be 1, if (i+fix(z/12))<12×z, the generator matrix modifying means sets an element $Gtmp_{i,i+fix(z/12)}$ at row i, column i+fix(z/12) of the binary generator matrix to be 1, if (i+fix(z/4))<12×z, the generator matrix modifying means sets an element $Gtmp_{i,i+fix(z/4)}$ at row i, column (i+fix(z/4)) of the binary generator matrix to be 1, if (i+fix(z/3))<12×z, the generator matrix modifying means sets an element $Gtmp_{i,i+fix(z/3)}$ at row i, column (i+fix(z/3) of the binary generator matrix to be 1, wherein i is within the range of 11×z to 12×z−1, fix denotes a floor operation, in the case when i is within the range of 0 to 11×z−1, j is within the range of 11×z to 12×z−1, and $Gtmp_{i,j}=Gtmp_{i,j}+Gtmp_{i,j+25*z}+Gtmp_{i,j+26*z}+Gtmp_{i,j+27*z}+Gtmp_{i,j+28*z}$, if $Gtmp_{i,j}>1$, the generator matrix modifying means sets the element $Gtmp_{i,j}$ at row i, column j of the binary generator matrix to be 1.

Wherein, the generator matrix modifying means modifies the modified binary generator matrix for the use of encoding, and permuting some columns of the check bit part of the binary generator matrix, for the purpose of further improving on the performance of LDGC codes when the overhead is very low.

For example, when the overhead is very low, the column weight of the check bit part of the binary generator matrix is relatively large (column weight>10), then, a column permutation is required to make some columns with a relatively light weight (column weight<5) appear in the check bit part of the binary generator matrix, which can improve the code performance when the overhead is very low. Wherein, the above check bit part refers to column L+1 to the last column, and the above column permutation refers to a position exchange between two columns. Finally, the above column permutation is not necessary.

Preferably, the generating process of matrix is interpenetrated in the subsequent encoding process.

By means of the present invention, code length flexibility of LDGC can be improved, and storage space for the base matrix can be reduced, so as to decrease the complexity of the code compiling.

DESCRIPTION OF THE FIGURES

The figures herein are provided for further understanding of the present invention and compose a portion of the application. The exemplary embodiments of the present invention and the illustration thereof are used to explain the present invention, but do not compose an inappropriate limit to the present invention. In the figures.

DETAILED DESCRIPTION OF EXEMPLARY EMBODIMENTS

With reference to the accompanying drawings, exemplary embodiments of the present invention will be described in detail.

Figure 1:
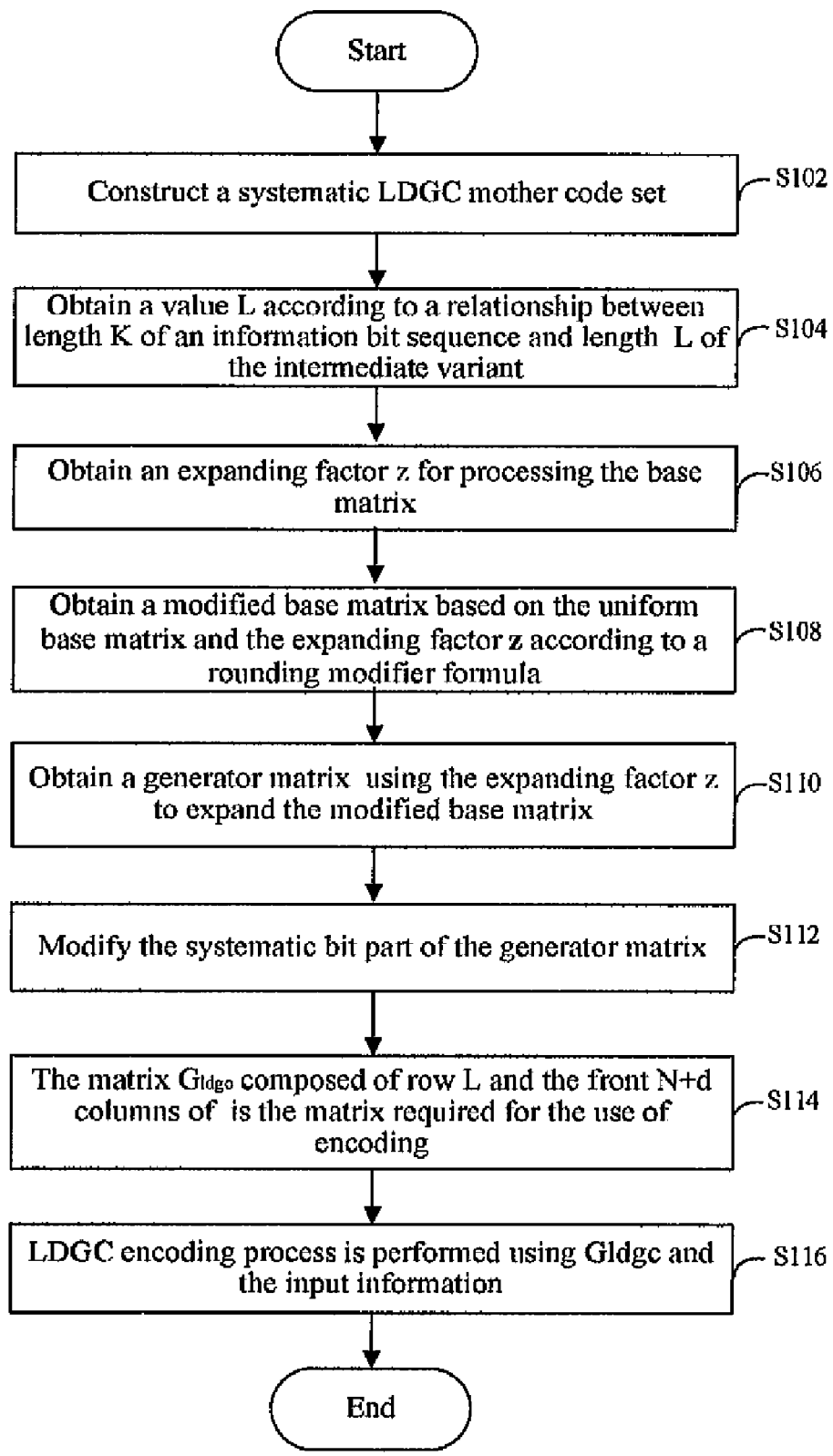
FIG. 1 is a flow chart of a encoding method for LDGC according to one embodiment of the present invention.

With reference to FIG. 1, a coding method for LDGC according to the embodiments of the present invention is described. As shown in FIG. 1, the method comprises the following steps:

S102, confirm an LDGC mother code set, wherein the mother code set is constructed by a finite number of LDGC with code rate $R_0=3/10$ and different code lengths, the mother code set has a base matrix $$G_b^{uniform} = \{g_{i,j}^b\}_{uniform\ k_b \times n_b}$$

| 0 | 434 | -1 | 78 | -1 | -1 | -1 | -1 | -1 | -1 | -1 | -1 | -1 | -1 | -1 | -1 | -1 | -1 | -1 | -1 | -1 | -1 | -1 | -1 | -1 | 217 | 357 | -1 | 582 | 642 | 511 | 565 | -1 | -1 | -1 | 294 | -1 | -1 | 45 | 577 | -1 | 113 | -1 | 42 | -1 |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|
| -1 | 0 | 525 | -1 | -1 | 213 | -1 | -1 | -1 | -1 | -1 | -1 | -1 | -1 | -1 | -1 | -1 | -1 | -1 | -1 | -1 | -1 | -1 | -1 | -1 | -1 | -1 | 366 | -1 | -1 | -1 | -1 | -1 | -1 | -1 | 659 | -1 | 392 | -1 | -1 | 560 | -1 | 387 | -1 | -1 |
| -1 | -1 | 0 | 36 | 587 | -1 | 117 | -1 | -1 | -1 | -1 | -1 | -1 | -1 | -1 | -1 | -1 | -1 | -1 | -1 | -1 | -1 | -1 | -1 | -1 | 433 | -1 | 33 | 179 | -1 | -1 | -1 | -1 | -1 | -1 | 585 | 592 | -1 | -1 | -1 | -1 | -1 | 1 | -1 | -1 |
| -1 | -1 | -1 | 0 | 23 | -1 | -1 | 558 | -1 | -1 | -1 | -1 | -1 | -1 | -1 | -1 | -1 | -1 | -1 | -1 | -1 | -1 | -1 | -1 | -1 | -1 | 76 | 469 | 183 | 439 | -1 | 223 | 367 | -1 | 452 | 226 | -1 | 40 | -1 | -1 | -1 | 486 | 209 | -1 | -1 |
| -1 | -1 | -1 | -1 | 0 | 428 | -1 | 0 | -1 | -1 | -1 | -1 | -1 | -1 | -1 | -1 | -1 | -1 | -1 | -1 | -1 | -1 | -1 | -1 | -1 | -1 | 116 | 24 | 419 | 13 | -1 | -1 | -1 | -1 | -1 | -1 | -1 | -1 | 214 | -1 | -1 | 276 | 620 | -1 | -1 |

[Matrix continues — full content is a large sparse matrix of integer entries with many -1 values]

that has a size of $k_b \times n_b = 12 \times 40$ and a uniform format. It should be pointed out that −1 is only used to denote $z*z$ zero square matrix, which can also be denoted by some other identifiers, such as ∞.

S104, assume a binary information bit data flow s (s can be shown as D8AB13 using hexadecimal number) of $1*K=1*24$ is encoded to generate 36-bit LDGC encoding codeword by the generator matrix generated by the method according to an embodiment of the present invention, then, K=24, N=36. Obtain length L of an intermediate variable according to a relationship $L=k_b \cdot ceil((p \times K+q)/k_b)=12 \cdot ceil((p \times K+q)/12)$ between length K of an information bit data flow and length L of the intermediate variable, wherein p=1.0235, q=30, ceil denotes a ceiling operation, L=60.

S106, obtain an expanding factor $$z = ceil\left(\frac{L}{k_b}\right) = \frac{60}{12} = 5$$

for processing the base matrix using the length of the intermediate variable and the number of columns in the base matrix.

S108, obtain a modified base matrix $G_b^{modified} = \{g_{i,j}^b\}_{k_b \times n_b}$ based on the base matrix $G_b^{uniform}$ and the expanding factor z=5, according to the following rounding (Scale+floor) modification formula. Wherein, all $(g_{i,j}^b)_{uniform}$ denoting nonzero subblock square matrix of $G_b^{uniform}$ are modified. Specifically, if for $(g_{i,j}^b)_{uniform} \neq -1$ (herein, −1 denotes $z*z$ zero square matrix) denoting a nonzero subblock square matrix in which i is from 0 to $k_b-1=11$ and j is from 0 to $n_b-1=39$, an operation of $g_{i,j,b}=floor(z \cdot (g_{i,j}^b)_{uniform}/z_{max})$ is performed, wherein $z_{max}=683$.

S110, expand $G_b^{modified}$ using the expanding factor z=5 to obtain a binary generator matrix Gtmp with a size of $(k_b \times z) \times (n_b \times z) = 60 \times 200$. Wherein, Gtmp is constructed by $k_b \times n_b = 12 \times 40 = 480$ subblock square matrixes with a size of $z \times z = 5 \times 5 = 25$, and these subblock square matrixes are zero matrixes, or unit matrixes, or cycle shift matrixes of unit matrix, as shown below:

$$Gtmp = \begin{bmatrix} P^{g_{0,0}^b} & P^{g_{0,1}^b} & P^{g_{0,2}^b} & \ldots & P^{g_{0,n_b-1}^b} \\ P^{g_{1,0}^b} & P^{g_{1,1}^b} & P^{g_{1,2}^b} & \ldots & P^{g_{1,n_b-1}^b} \\ \ldots & \ldots & \ldots & \ldots & \ldots \\ P^{g_{k_b-1,0}^b} & P^{g_{k_b-1,1}^b} & P^{g_{k_b-1,2}^b} & \ldots & P^{g_{k_b-1,n_b-1}^b} \end{bmatrix} = P^{G_b^{modified}}.$$

Wherein, if $g_{i,j}^b = -1$, $P^{g_{i,j}^b} = 0$ is defined; otherwise, $P^{g_{i,j}^b} = (P)^{g_{i,j}^b}$ is defined. Wherein, P square matrix with a size of $z \times z$ has the following format:

$$P = \begin{bmatrix} 0 & 1 & 0 & \ldots & 0 \\ 0 & 0 & 1 & \ldots & 0 \\ \ldots & \ldots & \ldots & \ldots & \ldots \\ 0 & 0 & 0 & \ldots & 1 \\ 1 & 0 & 0 & \ldots & 0 \end{bmatrix}.$$

S112, modify the systematic bit part of the generator matrix Gtmp.

If the binary generator matrix, i.e., all L rows and the front L columns of Gtmp, compose an upper right triangular matrix-, an element at row i−1, column i of the binary generator matrix is set to be 1, wherein i is within the range of 1 to z−1=4.

If the binary generator matrix, i.e., all L rows and the front L columns of Gtmp, compose an upper right triangular or a lower right triangular matrix, the column weight of column $(k_b-1)*z$ to column $k_b*z-1$ of the binary generator matrix is increased to be greater than or equal to 30, wherein offset is a positive integer within the range of 0 to z/3. The specific method is: herein, $k_b=12$, for i from $11 \times z = 11 \times 5 = 55$ to $12 \times z - 1 = 12 \times 5 - 1 = 59$, if $(i+1) < 12 \times z = 12 \times 5 = 60$, $Gtmp_{i,i+1} = 1$; if $(i+fix(z/12)) = (i+fix(5/12)) = i < 12 \times z = 12 \times 5 = 60$, $Gtmp_{i,i+fix(5/12)} = Gtmp_{i,i} = 1$; if $(i+fix(z/4)) = (i+fix(2/4)) = i < 12 \times z = 12 \times 5 = 60$, $Gtmp_{i,i+fix(2/4)} = Gtmp_{i,i} = 1$; if $(i+fix(z/3)) = (i+fix(5/3)) = I < 12 \times z = 12 \times 5 = 60$, $Gtmp_{i,i+fix(2/3)} = 1$. Further, for i from 0 to $11 \times z - 1 = 11 \times 5 - 1 = 54$, j from $11 \times z = 11 \times 5 = 55$ to $12 \times z - 1 = 12 \times 5 - 1 = 59$, $Gtmp_{i,j} = Gtmp_{i,j} + Gtmp_{i,j+25*z} + Gtmp_{i,j+26*z} + Gtmp_{i,j+27*z} + Gtmp_{i,j+28*z} = Gtmp_{i,j} + Gtmp_{i,j+25*5} + Gtmp_{i,j+26*5} + Gtmp_{i,j+27*5} + Gtmp_{i,j+28*5}$, if $Gtmp_{i,j} > 1$, the value of Gtmp is set to be 1. Wherein, $Gtmp_{i,j}$ denotes an element at row i, column j of matrix Gtmp, fix denotes a floor operation, and the addition therein is arithmetic addition.

Wherein, modify the modified binary generator matrix for the use of encoding, permuting some columns of the check bit part of the binary generator matrix, for the purpose of further improving on performance of LDGC codes when the overhead is very low.

For example, when the overhead is very low, the column weight of the check bit part of the binary generator matrix is relatively large (column weight>10), then, a column permutation is required to make some columns with a relatively light weight (column weight<5) appear in the check bit part of the binary generator matrix which can improve the performance of code when the overhead is very low. Wherein, the above check bit part refers to column L+1 to the last column, and the above column permutation refers to a position exchange between two columns. Finally, the above column permutation is not necessary.

S114, a matrix $G_{ldgc}$ composed of $k_b \times z = 60$ rows and the front $3k_b \times z = 360$ columns of Gtmp is the matrix for the use of encoding.

S116, LDGC encoding process can be performed using $G_{ldgc}$ and input information.

For example, encode the input LDGC (the information bit sequence m) having length K=24, generate M=36 check bit sequences, and construct a codeword sequence $C_{ldgc}$ having length of 60=24+36 using the information bit sequence and the check bit sequence. It should be pointed out that addition in the encoding step refers to modulo-two addition.

Assume $A_0, A_1, \ldots, A_{K-1}$ refers to an information bit sequence m having length of K=24; $B_0, B_1, \ldots, B_{L-1}$ refers to an information bit sequence s after being filled with known bit having length of L=60; $D_0, D_1, \ldots, D_{L-1}$ refers to a intermediate variable sequence I having length of L=60; $E_0, E_1, \ldots, E_{N+d-1}$ refers to a codeword sequence C before filled bit being removed having length of N+d=72; $F_0, F_1, \ldots, F_{N-1}$ refers to the codeword sequence $C_{ldgc}$ before filled bit being removed having length of N=36; $g_{ji}$ refers to an element at row j, column i of $G_{ldgc}$. The specific encoding process includes the following steps:

a. add d=L−K=60−24=36 known sequences (1, 1, 1, 1, 1 . . . ) after inputting an information bit sequence m to construct $1*L$ sequence s. Wherein, $B_i = A_i$ (i=0, 1, . . . , K−1), $B_i = 1$ (i=K, K+1, . . . , L−1).

b. since LDGC code is a systematic code, $I*G_{ldgc}(1:L,1:L) = I*G_{ldgc}(1:60,1:60) = s$. Since square matrix $G_{ldgc}(1:L,1:$ L)=$G_{ldgc}$ (1:60,1:60) composed of L rows, the front L columns of generator matrix $G_{ldgc}$ and a sequence s having length of L=60 are known, the intermediate variable I is then obtained by solving the formula, wherein $G_{ldgc}$ (1:L,1:L)= $G_{ldgc}$ (1:60,1:60) is a right upper triangular matrix, $D_0=B_0$, $$D_i = B_i + \sum_{j=0}^{i-1} D_j g_{j,i} \ (i = 1, \ldots, L-1).$$

c. calculate to obtain C having length of 1*72, according to C=I*$G_{ldgc}$ (1:L,1:N+d)=I*$G_{ldgc}$ (1:60,1:72). Wherein, $E_i=B_i$ (i=0, ..., L−1), $$E_i = \sum_{j=0}^{L-1} D_j g_{j,i} \ (i = L, \ldots, N+d-1).$$

d. delete d=36 filled bits in step a, to generate an encoded codeword $C_{ldgc}$ having length of 1*N=1*36. Wherein, $F_i=E_i$ (i=0, ..., K−1), $F_i=E_{i+d}$ (i=K, ..., N−1).

It should be pointed out that the above encoding method also comprises that, the generating process of matrix from step 1 to step 5 also can be interpenetrated in the encoding process in step 6, that is, a part of matrix information is generated in real time, then a part of the encoding operation is performed, and another part of matrix information is generated and another part of the encoding operation is then performed, and so on and so forth until the whole encoding process is completed.

In the above encoding process, the embodiments of the present invention include two kinds of situation: one is firstly generating a complete matrix $G_{ldge}$ composed of row $k_b \times z=60$ and the front $3k_b \times z=360$ columns, and then using the generated matrix $G_{ldge}$ to perform the encoding process of step a, step b, step c, and step d mentioned above; and the other is directly performing the encoding process of step a, step b, step c, and step d, according to the real-time requirement of matrix coefficients in encoding steps b, c, the generating process of matrix (from step 1 to step 5) shall produce the part of matrix coefficient needed.

For example, when calculating $D_i$ in the encoding process, the generating process of matrix only needs to generate $\{g_{j,i}\}$ j=0, ..., i −1 in real time, wherein i=1, ..., L−1; when calculating $E_i$ in the encoding process, the generating process of matrix only needs to generate $\{g_{j,i}\}$ j=0, ..., L−1 in real time, wherein i=L, ..., N +d−1. In this way, the generating process of matrix is interpenetrated in the encoding process, and only a part of the matrix coefficient is required to be generated according to encoding, which is favorable for storage reduction.

It should be pointed out that the present invention is not limited to adopt the encoding method mentioned above.

Figure 2:
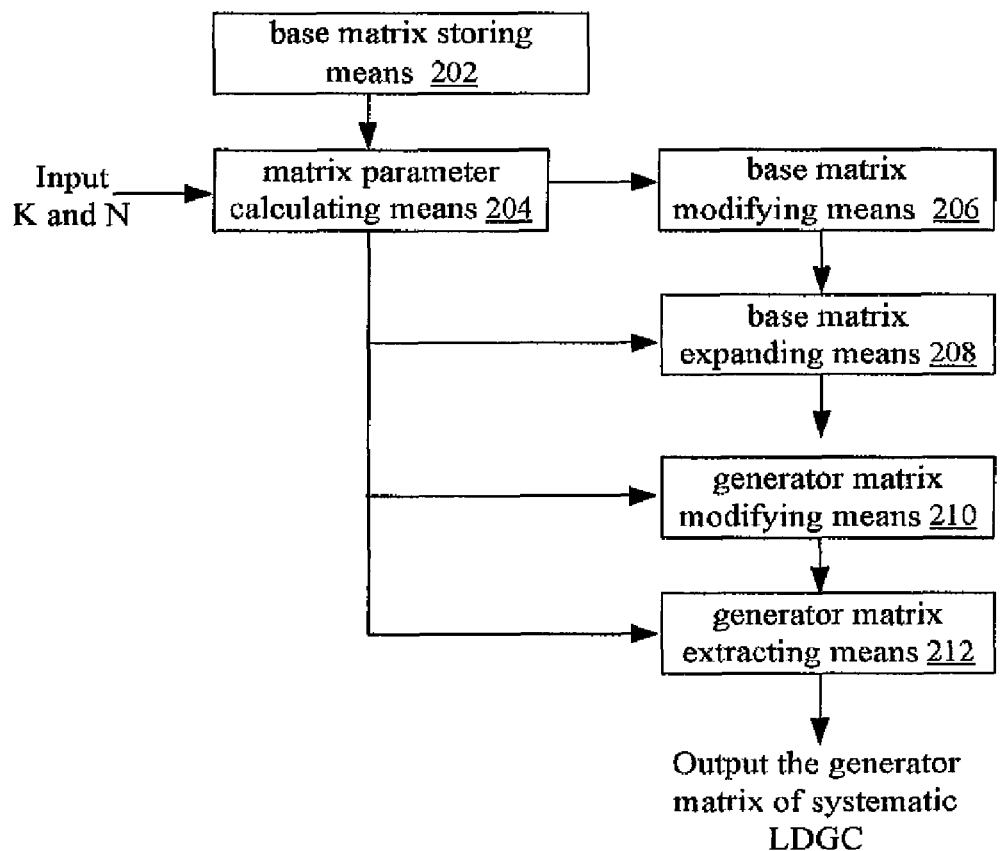
FIG. 2 is a block diagram of generating device of generator matrix for LDGC according to one embodiment of the invention.

With reference to FIG. 2, a generating device of generator matrix for LDGC according to one embodiment of the present invention is shown. As shown in FIG. 2, the device comprises: base matrix storing means 202, matrix parameter calculating means 204, base matrix modifying means 206, base matrix expanding means 208, generator matrix modifying means 210, and generator matrix extracting means 212. Wherein:

the base matrix storing means is used for storing a uniform base matrix $G_b^{uniform}$ of an LDGC mother code set constructed by P LDGC with code rate $R_0$ and different code lengths, wherein $$R_0 = \frac{k_b}{n_b},$$

$k_b$ is the number of rows in the base matrix, $n_b$ is the number of columns in the base matrix.

The matrix parameter calculating means is used for calculating length L of an intermediate variable, according to a relationship between length K of an information bit sequence to be encoded in the LDGC mother code set and length L of the intermediate variable, and calculating an expanding factor z for processing the base matrix using the length L of the intermediate variable and the number of rows $k_b$ in the base matrix.

The base matrix modifying means is used for modifying the base matrix using the expanding factor z, to obtain a modified base matrix $G_b^{modified}$.

The base matrix expanding means is used for expanding $G_b^{modified}$ using the expanding factor z to obtain a binary generator matrix Gtmp that has not been modified.

The generator matrix modifying means is used for modifying Gtmp, and increasing the column weight of some columns of Gtmp to obtain a modified Gtmp.

The generator matrix extracting means is used for extracting a matrix $G_{ldgc}$ composed of L rows and the front N+L−K columns of the modified Gtmp which is taken as an LDGC generator matrix.

Wherein, a relationship between the length of the information bit sequence and the length of the intermediate variable is as follows: L=$k_b$·ceil((p×K+q)/$k_b$), wherein $k_b$=12, p=1.0235, q=30, ceil denotes a ceiling operation. The matrix parameter calculating means obtains the expanding factor using the length of the intermediate variable and the number of rows in the base matrix through the following method: z=L/$k_b$.

Wherein, the base matrix modifying means modifies all $(g_{i,j}^b)_{uniform}$ denoting nonzero subblock square matrixes in the base matrix using the expanding factor. Specifically, the base matrix modifying means performs the following modifying operation to all elements denoting nonzero subblock square matrixes in the base matrix using the expanding factor: $g_{i,j}^b$=floor(z·$(g_{i,j}^b)_{uniform}$/$z_{max}$, wherein $z_{max}$=683, floor denotes a floor operation.

Wherein, the binary generator matrix is composed of $k_b \times n_b$ subblock square matrixes $P^{g_{i,j}^b}$ with a size of z×z, wherein the subblock square matrix with a size of z×z is a zero matrix, a unit matrix, or a cycle shift matrix of a unit matrix. Specifically, if the modified base matrix is an element denoting a z*z zero square matrix, the subblock square matrix with a size of z×z $P^{g_{i,j}^b}$=0, otherwise, subblock square matrix with a size of z×z, $P^{g_{i,j}^b}=(P)^{g_{i,j}^b}$, wherein $$P = \begin{bmatrix} 0 & 1 & 0 & \ldots & 0 \\ 0 & 0 & 1 & \ldots & 0 \\ \ldots & \ldots & \ldots & \ldots & \ldots \\ 0 & 0 & 0 & \ldots & 1 \\ 1 & 0 & 0 & \ldots & 0 \end{bmatrix}.$$

Wherein, if all L rows and the front L columns of the binary generator matrix compose an upper right triangular matrix or a lower right triangular matrix, the generator matrix modifying means increases the column weight of column offset to column z−1 of the binary generator matrix to be 2, and increases the column weight of column ($k_b$−1)*z to column $k_b*z-1$ of the binary generator matrix to be greater than or equal to 30, wherein offset is a positive integer within the range of 0 to z/3.

If all L rows and the front L columns of the binary generator matrix compose an upper left triangular matrix or a lower left triangular matrix, the generator matrix modifying means increases the column weight of column $(k_b-1)*z+$offset to column $k_b*z-1$ of the binary generator matrix to be 2, and increases the column weight of column $11*z$ to column $12*z-$offset of the binary generator matrix to be greater than or equal to 30, wherein offset is a positive integer within the range of 0 to z/3.

Wherein, the generator matrix modifying means modifies the modified binary generator matrix for the use of encoding, and permuting some columns of the check bit part of the binary generator matrix, for the purpose of further improving on performance of LDGC codes when the overhead is very low.

For example, when the overhead is very low, the column weight of the check bit part of the binary generator matrix is relatively large (column weight>10), then, a column permutation is required to make some columns with a relatively light weight (column weight<5) appear in the check bit part of the binary generator matrix, which can improve the performance of code when the overhead is very low. Wherein, the above check bit part refers to column L+1 to the last column, and the above column permutation refers to a position exchange between two columns. Finally, the above column permutation is not necessary.

It should be pointed out that: the above matrix generating device further comprises that the generating process of matrix also can be interpenetrated in the subsequent encoding process, that is, the matrix generating device generates a part of the matrix information in real time and then performs a part of the encoding operation, and then, the matrix generating device further generates another part of matrix information and performs another part of the encoding operation, and so on and so forth, until the whole encoding process is completed.

The above-mentioned content is only embodiments of the present invention and not used to limit the invention. For the person skilled in the art, the present invention can have various alterations and changes. Any modification, equivalent replacement, improvement, and etc. made to the present invention within the spirit and scope thereof should be contained in the claims appending the present invention.

The invention claimed is:

1. An encoding method for Low Density Generator Matrix Codes, LDGC, comprising the following steps:
   step 1, constructing an LDGC mother code set using a plurality of LDGC with code rate $R_0$ and different code lengths, wherein the LDGC mother code set has a uniform base matrix $G_b^{uniform}=\{(g_{i,j}^b)_{uniform}\}_{k_b \times n_b}$, $$R_0 = \frac{k_b}{n_b},$$

$k_b$ is the number of rows in the base matrix, and $n_b$ is the number of columns in the base matrix;
   step 2, obtaining length L of an intermediate variable according to a relationship between length K of an information bit sequence to be encoded in the LDGC mother code set and length L of the intermediate variable;
   step 3, obtaining an expanding factor z for processing the base matrix using the length of the intermediate variable and the number of rows in the base matrix;
   step 4, processing the base matrix using the expanding factor to obtain a binary generator matrix Gtmp wherein the front L rows and the front L columns of the binary generator matrix compose a triangular matrix;
   step 5, modifying the binary generator matrix to obtain a modified binary generator matrix; and
   step 6, taking a matrix $G_{ldgc}$ composed of L rows and the front N+L-K columns of the modified binary generator matrix as a generator matrix of the information bit sequence to encode the information bit sequence.

2. The method according to claim 1, wherein step 4 comprises the following steps:
   step a, modifying the base matrix using the expanding factor to obtain a modified base matrix $G_b^{modified}=\{g_{i,j}^b\}_{k_b \times n_b}$, and
   step b, expanding the modified base matrix using the expanding factor to obtain the binary generator matrix, wherein the binary generator matrix has a size of $(k_b \times z) \times (n_b \times z)$.

3. The method according to claim 2, wherein in step 2, the relationship between the length of the information bit sequence and the length of the intermediate variable is as follows: $L = k_b \cdot \text{ceil}((p \times K+q)/k_b)$, wherein both p and q are constants greater than 0, ceil denotes a ceiling operation, wherein $k_b=12$, p=1.0235, q=30.

4. The method according to claim 3, wherein in step 3, the expanding factor is obtained using the length of the intermediate variable and the number of rows in the base matrix through the following methods: $z=L/k_b$, wherein the number of rows in the base matrix is 12, the number of columns is 40.

5. The method according to claim 4, wherein in step a, all elements $(g_{i,j}^b)_{uniform}$ denoting nonzero subblock square matrixes in the base matrix are modified using the expanding factor, wherein the following modifying operation is performed to all elements $(g_{i,j}^b)_{uniform}$ denoting nonzero subblock square matrixes in the base matrix using the expanding factor: $g_{i,j}^b=\text{floor}(z \cdot (g_{i,j}^b)_{uniform}/z_{max})$, wherein $z_{max}$ is a specific positive integer, floor denotes a floor operation, wherein $z_{max}=683$.

6. The method according to claim 4, wherein in step b, the binary generator matrix is constituted of $k_b \times n_b$ subblock square matrixes $P^{g_{i,j}^b}$ with a size of $z \times z$, wherein the subblock square matrix with a size of $z \times z$ is a zero matrix, a unit matrix, or a cycle shift matrix of a unit matrix, wherein in step b, if the element $g_{i,j}^b$ of the modified base matrix is a numerical value denoting a $z \times z$ zero matrix, the subblock square matrix $P^{g_{i,j}^b}=0$, wherein the subblock square matrix $P^{g_{i,j}^b}$ has a size of $z \times z$, otherwise, the subblock square matrix $P^{g_{i,j}^b}=(P)^{g_{i,j}^b}$, wherein the subblock square matrix $P^{g_{i,j}^b}$ has a size of $z \times z$, and $$P = \begin{bmatrix} 0 & 1 & 0 & \ldots & 0 \\ 0 & 0 & 1 & \ldots & 0 \\ \ldots & \ldots & \ldots & \ldots & \ldots \\ 0 & 0 & 0 & \ldots & 1 \\ 1 & 0 & 0 & \ldots & 0 \end{bmatrix}.$$

7. The method according to claim 6, wherein in step 5, if the front L rows and the front L columns of the binary generator matrix compose an upper right triangular matrix, the column weight of column offset to column z-1 of the binary generator matrix is increased to be 2, wherein offset is a positive integer within the range of 0 to z/3, wherein the element at row i-1, column i of the binary generator matrix is set to be 1, wherein i is within the range of 1 to z−1.

8. The method according to claim 6, wherein in step 5, if the front L rows and the front L columns of the binary generator matrix compose an upper right triangular matrix, the column weight of column $(k_b-1)*z$ to column $k_b*z-1$ of the binary generator matrix is increased to be greater than or equal to 30, wherein offset is a positive integer within the range of 0 to z/3, wherein if (i+1)<12×z, an element $Gtmp_{i,i+1}$ at row i, column i+1 of the binary generator matrix is set to be 1, if (i+fix(z/12))<12×z, an element $Gtmp_{i,i+fix(z/12)}$ at row i, column i+fix(z/12) of the binary generator matrix is set to be 1, if (i+fix(z/4))<12×z, an element $Gtmp_{i,i+fix(z/4)}$ at row i, column (i+fix(z/4)) of the binary generator matrix is set to be 1, if (i+fix(z/3))<12×z, an element $Gtmp_{i,i+fix(z/3)}$ at row i, column(i+fix(z/3) of the binary generator matrix is set to be 1, wherein i is within the range of 11×z to 12×z−1, fix denotes a floor operation, in the case when i is within the range of 0 to 11×z−1, j is within the range of 11×z to 12×z−1, and $Gtmp_{i,j}=Gtmp_{i,j}+Gtmp_{i,j+25*z}+Gtmp_{i,j+26*z}+Gtmp_{i,j+27*z}+Gtmp_{i,j+28*z}$, if $Gtmp_{i,j}$22 1, the element $Gtmp_{i,j}$ at row i, column j of the binary generator matrix is set to be 1.

9. The method according to claim 6, wherein in step 5, if the front L rows and the front L columns of the binary generator matrix compose a lower right triangular matrix, the column weight of column offset to column z−1 of the binary generator matrix is increased to be 2, and the column weight of column $(k_b-1)*z$ to column $k_b*z-1$ of the binary generator matrix is increased to be greater than or equal to 30, wherein offset is a positive integer within the range of 0 to z/3, if the front L rows and the front L columns of the binary generator matrix compose an upper left triangular or a lower left triangular matrix, the column weight of column $(k_b-1)*z$+offset to column $k_b*z-1$ of the binary generator matrix is increased to be 2, and the column weight of column 11*z to column 12*z−offset of the binary generator matrix is increased to be greater than or equal to 30, wherein offset is a positive integer within the range of 0 to z/3.

10. The method according to claim 1, wherein in step 5, modifying the modified binary generator matrix for the use of encoding, permuting some columns of the check bit part of the binary generator matrix, wherein when overhead is very low, the column weight of the check bit part of the binary generator matrix is relatively large (column weight>10), some columns with relatively light weight (column weight <5) appear in the check bit part of the binary generator matrix due to the column permutation, wherein the column permutation refers to a position exchange between two columns.

11. The method according to claim 1, wherein the matrix generating process from step 1 to step 5 is interpenetrated in the encoding process in step 6.

12. A device for generating a generator matrix for Low Density Generator matrix Codes, LDGC, comprising:
base matrix storing means, for storing a uniform base matrix $G_b^{uniform}$ of an LDGC mother code set constructed by a plurality of LDGC with code rate $R_0$ and different code lengths, wherein $$R_0 = \frac{k_b}{n_b},$$

$k_b$ is the number of rows in the base matrix, $n_b$ is the number of columns in the base matrix;
matrix parameter calculating means, for calculating the length L of an intermediate variable according to a relationship between length K of an information bit sequence to be encoded in the LDGC mother code set and length L of the intermediate variable, and calculating an expanding factor z for processing the base matrix using the length of the intermediate variable and the number of rows in the base matrix;
base matrix modifying means, for modifying the base matrix using the expanding factor to obtain a modified base matrix $G_b^{modified}$;
base matrix expanding means, for expanding the modified base matrix using the expanding factor to obtain a binary generator matrix Gtmp, wherein the front L rows and the front L columns of the binary generator matrix compose a triangular matrix;
generator matrix modifying means, for modifying the binary generator matrix to obtain a modified binary generator matrix; and
generator matrix extracting means, for extracting L rows and the front N+L−K columns of the modified binary generator matrix, which is taken as a generator matrix $G_{ldgc}$ for the use of encoding the information bit sequence, wherein N is the length of output codeword after encoding the information bit sequence.

13. The device according to claim 12, wherein the relationship between the length of the information bit sequence and the length of the intermediate variable is as follows: $L=k_b·ceil((p×K+q)/k_b)$, wherein both p and q are constants greater than 0, ceil denotes a ceiling operation, wherein $k_b=12$, $p=1.0235$, $q=30$.

14. The device according to claim 12, wherein the matrix parameter calculating means obtains the expanding factor using the length of the intermediate variable and the number of rows in the base matrix through the following method: $z=L/k_b$, wherein the base matrix modifying means modifies the elements $(g_{i,j}^b)_{uniform}$ denoting all nonzero subblock square matrixes in the base matrix using the expanding factor, wherein the base matrix modifying means performs the following modifying operation to the elements $(g_{i,j}^b)_{uniform}$ denoting all nonzero subblock square matrixes in the base matrix using the expanding factor: $g_{i,j}^b$=floor$(z·(g_{i,j}^b)_{uniform}/z_{max})$, wherein $z_{max}$ is a specific positive integer, floor denotes a floor operation, wherein $z_{max}=683$.

15. The device according to claim 14, wherein the base matrix expanding means obtains the binary generator matrix, which is composed of $k_b×n_b$ subblock square matrixes $P^{g_{i,j}^b}$ with a size of z×z, by expanding the modified base matrix using the expanding factor wherein the subblock square matrix with a size of z×z is a zero matrix, a unit matrix, or a cycle shift matrix of a unit matrix, wherein if element $g_{i,j}^b$ of the modified base matrix is a numerical value denoting z*z zero square matrix, the subblock square matrix $P^{g_{i,j}^b}=0$, wherein the subblock square matrix $P^{g_{i,j}^b}$ has a size of z×z, otherwise, the subblock square matrix $P^{g_{i,j}^b}=(P)^{g_{i,j}^b}$, wherein the subblock square matrix $P^{g_{i,j}^b}$ has a size of z×z, and $$P = \begin{bmatrix} 0 & 1 & 0 & \ldots & 0 \\ 0 & 0 & 1 & \ldots & 0 \\ \ldots & \ldots & \ldots & \ldots & \ldots \\ 0 & 0 & 0 & \ldots & 1 \\ 1 & 0 & 0 & \ldots & 0 \end{bmatrix}.$$

16. The device according to claim 15, wherein the generator matrix modifying means modifies the binary generator matrix through the following method: if the front L rows and the front L columns of the binary generator matrix compose an upper right triangular matrix, the generator matrix modifying means increases the column weight of column offset to column z−1 of the binary generator matrix to be 2, wherein offset is a positive integer within the range of 0 to z/3, wherein the generator matrix modifying means sets the element at row i−1, column i of the binary generator matrix to be 1, wherein i is within the range of 1 to z−1.

17. The device according to claim 15, wherein the generator matrix modifying means modifies the binary generator matrix through the following method: if the front L rows and the front L columns of the binary generator matrix compose an upper right triangular matrix, the column weight of column $(k_b-1)*z$ to column $k_b*z-1$ of the binary generator matrix is increased to be greater than or equal to 30, wherein offset is a positive integer within the range of 0 to z/3, wherein if (i+1)<12×z, the generator matrix modifying means sets an element $Gtmp_{i,i+1}$ at row i, column i+1 of the binary generator matrix to be 1, if (i+fix(z/12))<12×z, the generator matrix modifying means sets an element $Gtmp_{i,i+fix(z/12)}$ at row i, column i+fix(z/12) of the binary generator matrix to be 1, if (i+fix(z/4))<12×z, the generator matrix modifying means sets an element $Gtmp_{i,i+fix(z/4)}$ at row i, column (i+fix(z/4)) of the binary generator matrix to be 1, if (i+fix(z/3))<12×z, the generator matrix modifying means sets an element $Gtmp_{i,i+fix(z/3)}$ at row i, column (i+fix(z/3) of the binary generator matrix to be 1, wherein i is within the range of 11×z to 12×z−1, fix denotes a floor operation, in the case when i is within a range of 0 to 11×z−1, j is within the range of 11×z to 12×z−1, and $Gtmp_{i,j}=Gtmp_{i,j}+Gtmp_{i,j+25*z}+Gtmp_{i,j+26*z}+Gtmp_{i,j+27*z}+Gtmp_{i,j+28*z}$, if $Gtmp_{i,j}>1$, the generator matrix modifying means sets the element $Gtmp_{i,j}$ at row i, column j of the binary generator matrix to be 1.

18. The device according to claim 15, wherein the generator matrix modifying means modifies the binary generator matrix through the following method: if the front L rows and the front L columns of the binary generator matrix compose a lower right triangular matrix, the generator matrix modifying means increases the column weight of column offset to column z−1 of the binary generator matrix to be 2, and increases the column weight of column $(k_b-1)*z$ to column $k_b*z-1$ of the binary generator matrix to be greater than or equal to 30, wherein offset is a positive integer within the range of 0 to z/3, or the generator matrix modifying means modifies the binary generator matrix through following method: if the front L rows and the front L columns of the binary generator matrix compose an upper left triangular or a lower left triangular matrix, the generator matrix modifying means increases the column weight of column $(k_b-1)*z$+offset to column $k_b*z-1$ of the binary generator matrix to be 2, and increases the column weight of column 11*z to column 12*z−offset of the binary generator matrix to be greater than or equal to 30, wherein offset is a positive integer within the range of 0 to z/3.

19. The device according to claim 12, wherein the generator matrix modifying means modifies the modified binary generator matrix for the use of encoding, and permuting some columns of the check bit part of the binary generator matrix, wherein when overhead is very low, the column weight of the check bit part of the binary generator matrix is relatively large (column weight>10), some columns with relatively light weight (column weight<5) appear in the check bit part of the binary generator matrix due to the column permutation, wherein the column permutation refers to a position exchange between two columns.

20. The device according to claim 12, wherein the matrix generating process is interpenetrated in subsequent coding process.

* * * * *